(12) United States Patent
Faris

(10) Patent No.: US 7,413,638 B2
(45) Date of Patent: Aug. 19, 2008

(54) NANOLITHOGRAPHY AND MICROLITHOGRAPHY DEVICES AND METHOD OF MANUFACTURING SUCH DEVICES

(75) Inventor: Sadeg M. Faris, Pleasantville, NY (US)

(73) Assignee: Reveo, Inc., Hawthorne, NY (US)

( * ) Notice: Subject to any disclaimer, the term of this patent is extended or adjusted under 35 U.S.C. 154(b) by 63 days.

(21) Appl. No.: 11/077,542

(22) Filed: Mar. 10, 2005

(65) Prior Publication Data

US 2006/0202294 A1 Sep. 14, 2006

(51) Int. Cl.
*C25D 17/00* (2006.01)
*B29C 65/00* (2006.01)
*B23H 3/04* (2006.01)

(52) U.S. Cl. .............................. 204/290.01; 204/224 R; 156/60

(58) Field of Classification Search ................ 204/279, 204/280, 281, 288, 288.1, 288.2, 290.01; 156/151, 308, 308.2, 307.7, 307.1
See application file for complete search history.

(56) References Cited

U.S. PATENT DOCUMENTS

| | | | | | |
|---|---|---|---|---|---|
| 3,259,475 | A | * | 7/1966 | Burnham | 428/606 |
| 4,606,787 | A | * | 8/1986 | Pelligrino | 216/18 |
| 6,423,193 | B1 | * | 7/2002 | Miller et al. | 204/242 |
| 2004/0129578 | A1 | * | 7/2004 | McLachlan et al. | 205/742 |

* cited by examiner

*Primary Examiner*—Nam X Nguyen
*Assistant Examiner*—Luan V Van
(74) *Attorney, Agent, or Firm*—Ralph J. Crispino

(57) ABSTRACT

A lithography device includes one or more conductive strips monolithically embedded within an insulative structure. A method of manufacturing a lithography device includes monolithically forming a conductive strip through an insulative structure. Monolithically forming such a device includes forming the conductive strip on an mixed conductive-insulative layer, and embedding the conductive-insulative layer layer within the insulative structure. Such a device may readily be manufactured, is reliable, and is capable of various lithography applications and other applications requiring sub-micron and nano-scale electrode devices and electrode arrays.

4 Claims, 11 Drawing Sheets

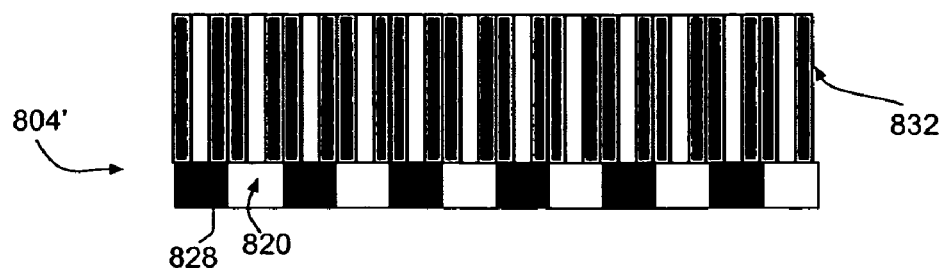
FIGURE 14A
FIGURE 14B
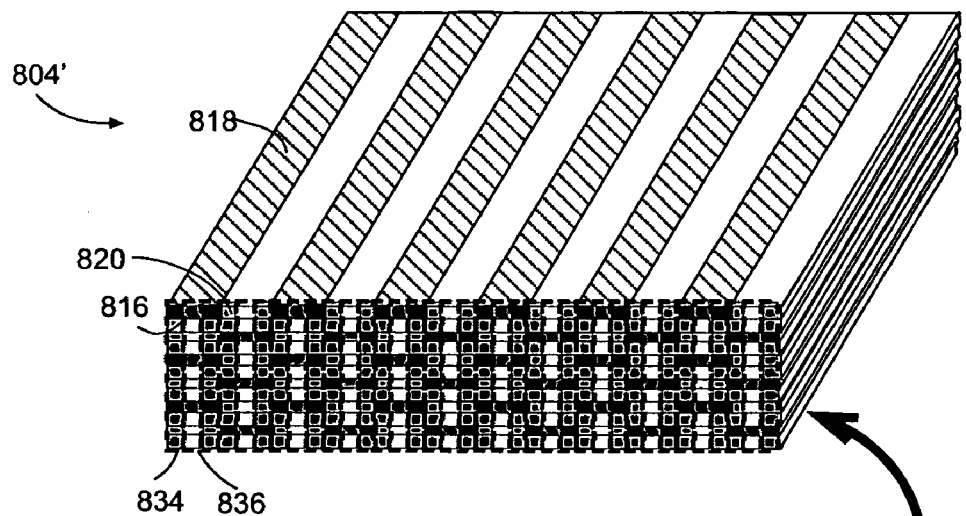
FIGURE 15

NANOLITHOGRAPHY AND MICROLITHOGRAPHY DEVICES AND METHOD OF MANUFACTURING SUCH DEVICES

BACKGROUND

Lithography is ubiquitous, and there are a multitude of processes and products that rely on lithography as one or more of its processing steps. An obstacle in many lithography systems is the ability to create sub 100 nanometer line width patterns.

Conventional optical lithographic systems is generally based on directing light beams on a photosensitive surface covered by a mask, whereby a desired pattern is etched on the surface. However, typical optical systems are limited in scale due to optical diffraction. To overcome this, x-ray and electron beam optical sources have been used. However, such optical sources invariably require complex systems. Further, such systems are limited to certain materials consistent with the chemical resist materials.

Thus, it would be desirable to provide a device that overcomes these obstacles, and a method of manufacturing such a device.

Such a device should be inexpensive to manufacture, reliable, and capable of various lithography applications and other applications requiring sub-micron and nano-scale devices.

SUMMARY

The above-discussed and other problems and deficiencies of the prior art are overcome or alleviated by the several methods and apparatus of the present invention for a lithography device and a method of manufacturing such a device.

The lithography device includes one or more conductive strips monolithically embedded within an insulative structure.

A method of manufacturing a lithography device includes monolithically forming a conductive strip through an insulative structure.

Monolithically forming such a device includes forming the conductive strip on an mixed conductive-insulative layer, and embedding the conductive-insulative layer layer within the insulative structure.

Such a device may readily be manufactured, is reliable, and is capable of various lithography applications and other applications requiring sub-micron and nano-scale electrode devices and electrode arrays.

The above-discussed and other features and advantages of the present invention will be appreciated and understood by those skilled in the art from the following detailed description and drawings.

BRIEF DESCRIPTION OF THE DRAWINGS

FIGS. 14A,14B and 15 show an electrochemical method of forming electrode tips;

DETAILED DESCRIPTION

Figure 1:
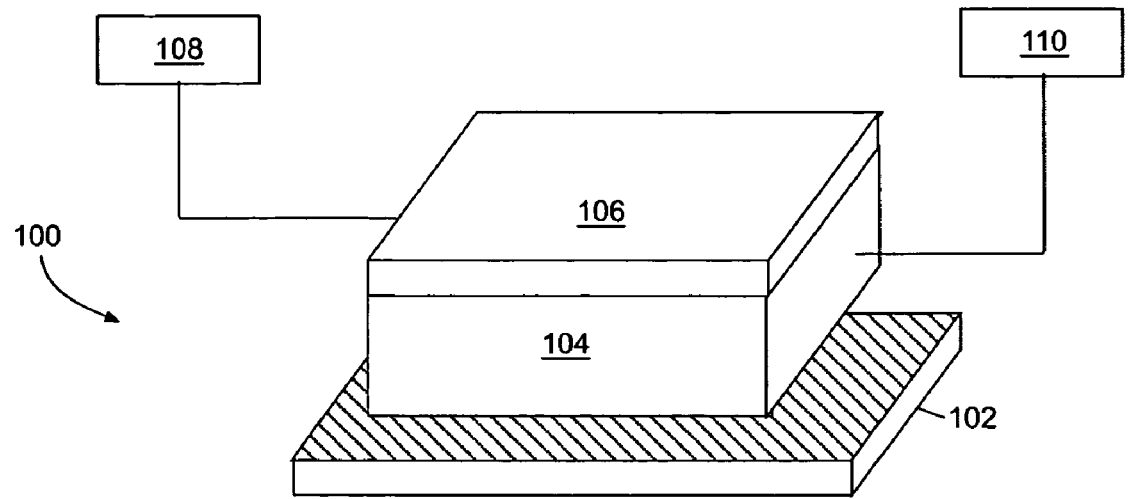
FIG. 1 shows an overview of an embodiment of a lithography system detailed herein.

Referring now to FIG. 1, a lithography system 100 is shown. The system generally includes a substrate 102 (e.g., to be lithographically patterned), a lithography electrode device 104 and a microchip 106 in electrical communication, optical communication, or other suitable form of connectivity with electrode tips of the lithography electrode device 104. The assembly of the lithography electrode device 104 and the microchip 106 may be positionally controlled, e.g., with a suitable x-y motion device 110. The microchip 106 is connected to a suitable controller 108, e.g., shown with suitable wires. Of course, other controller sub-systems may be employed, including wireless (e.g., RF) transmitter-receiver sub-systems, optical transmitter-receiver sub-systems, preprogrammed or programmable integrated microprocessors within microchip 106, micro-electro-mechanical, and/or other suitable controller sub-systems integrated in or associated with the microchip 106. Note the controller 108 may be integral with microchip 106 (e.g., wherein controller functionality is integrated in microchip 106) or a separate sub-system in suitable communication as described herein.

Figure 2:
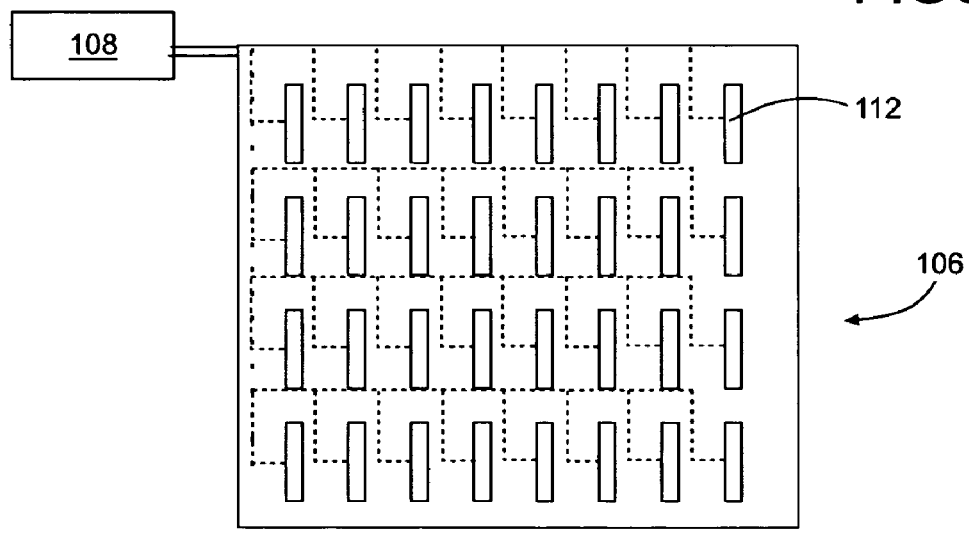
FIG. 2 shows a top view of a microchip employed in the system of FIG. 1.

Referring to FIG. 2, a top view of the microchip 106 is depicted. The microchip 106 includes plural switches or other devices 112 for selectively activating associated electrodes (not shown). These switches or other devices 112 are operably connected to the controller 108.

Figure 3A:
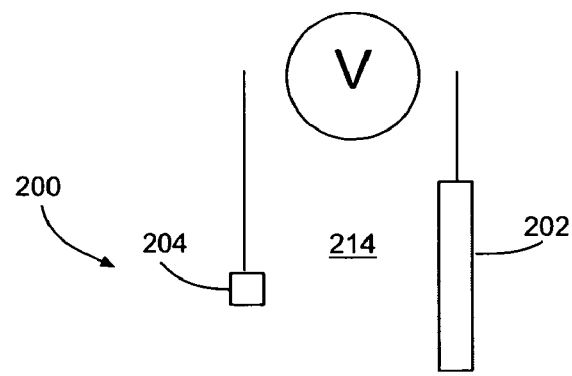
FIGS. 3A and 3B show a generalized schematic of an electrochemical lithography system.
Figure 3B:
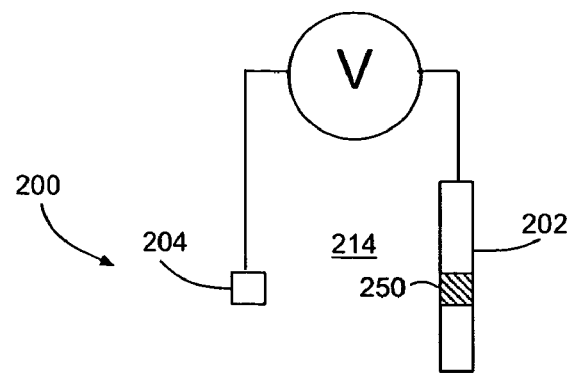

Referring now to FIGS. 3A and 3B, a generalized schematic depiction of an electrochemical lithography system 200 is provided. In general, electrodes 202, 204 are separated by an electrolyte 214. The polarity of the electrodes 202, 204 depend on the type of electrochemistry undertaken by the system 200. As used herein, electrochemical lithography may refer to oxidation or reduction. Upon application of a voltage differential or field between the electrodes, a lithography mark 250 will be formed. Alternatively, as will be apparent to one skilled in the art, a current source may be used to apply current through the lithography electrodes 204.

For example, in certain embodiments, where lithography occurs by oxidizing the workpiece or substrate, electrode 202 serves as the positive electrode or cathode, and electrode 204 serves as the negative electrode or anode, whereby the electron flow is between the lithographing tool negative electrode 204 to the substrate positive electrode 202.

In other embodiments, where lithography occurs by reducing a workpiece or substrate, electrode 202 serves as the negative electrode or anode, and electrode 204 serves as the positive electrode or cathode, whereby the electron flow is between the substrate positive electrode 202 to the lithographing tool negative electrode 204. In this embodiment, the substrate positive electrode may be electroplated, e.g., by depositing metal ions from the electrolyte solution 214.

Figure 4:
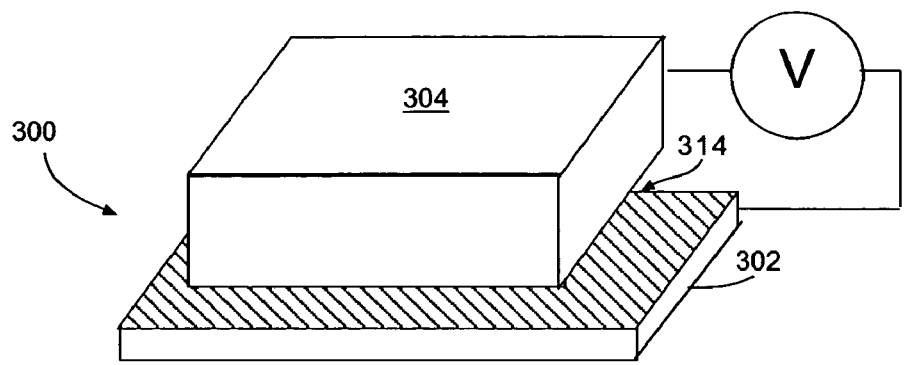
FIG. 4 shows a lithographing tool in the form of an electrode or array of electrodes associated with a substrate.

Referring now to FIG. 4, a system 300 is depicted including a lithographing tool in the form of an electrode or array of electrodes 304 lithographing on a workpiece or substrate as an electrode 302.

Figure 5:
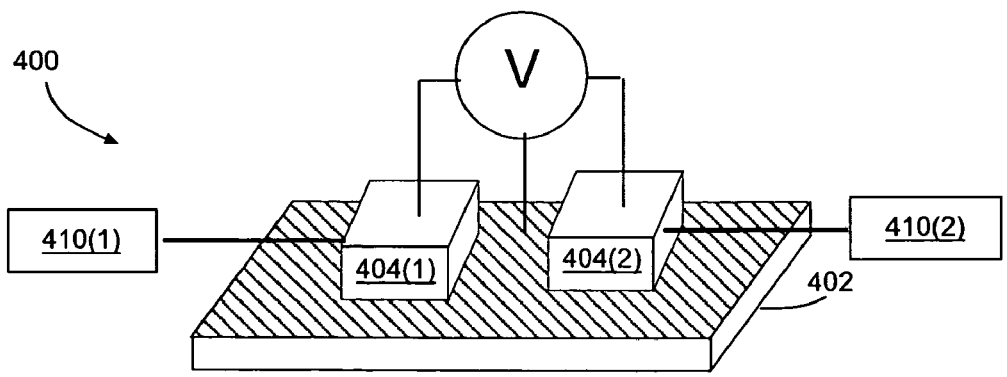
FIG. 5 shows a plurality of lithographing tools in the form of electrodes or arrays of electrodes associated with a substrate.

Referring now to FIG. 5, a system 500 is depicted including a plurality of lithographing tools in the form of electrodes or arrays of electrodes 404(1) and 404(2). These electrodes or arrays 404(1) and 404(2) lithograph a workpiece or substrate, which operates as an electrode 402 for the electrochemical lithography processes described herein. These may each be connected, for example, to a separate x,y motion device 410(1) and 410(2), respectively. The operation of each lithographing tool is similar to that described above with respect to FIGS. 3 and 4.

Figures 6A, 6B:
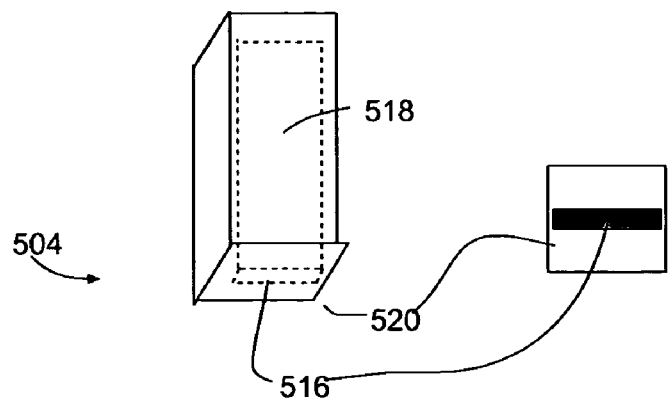
FIGS. 6A and 6B show enlarged views of a single tip in certain embodiments.

Referring now to FIGS. 6A and 6B, an enlarged view of a single tip 516 of an electrode 504 is shown. Tip 516 is contiguous with a conductor 518, which is adjacent to insulative material 520. Tip 516 may be fabricated in very small dimensions, approaching the order of 10s of nanometers in cross-sectional area.

Figures 7A, 7B:
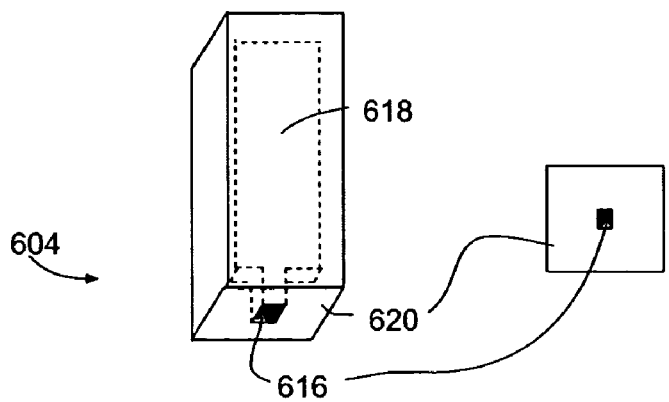
FIGS. 7A and 7B show enlarged views of a single tip in other embodiments

Referring now to FIGS. 7A and 7B, an enlarged view of a single tip 616 of an electrode 604 is shown. Tip 616 is adjacent to insulative material 620. Tip 616 may be fabricated in very small dimensions, approaching the order of 10s of nanometers in area. Note that the tip 616 is contiguous with a conductor 518, which is larger in cross-sectional dimension than the tip 616. This facilitates formation of smaller size marks or traces (e.g., 250 as shown with respect to FIGS. 3A and 3B described above).

Figure 8:
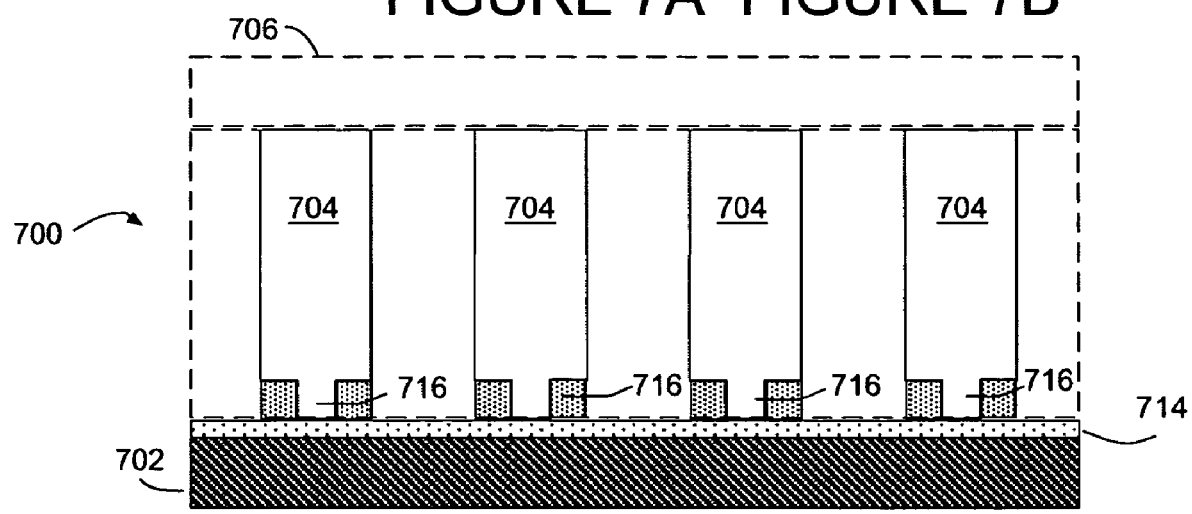
FIG. 8 shows a device having an array of electrodes suitable for electrochemical lithography associated with a substrate.

Referring now to FIG. 8, a device 700 includes an array of electrodes 704 suitable for electrochemical lithography upon a substrate 702, the electrodes 704 operably associated with controller 706. As shown, the electrodes 704 have tips 716 of smaller diameter than the remaining body of the electrodes 704, as in electrodes 604 of FIG. 7, however, electrodes 504 shown in FIG. 6 may also be employed.

Figure 9A:
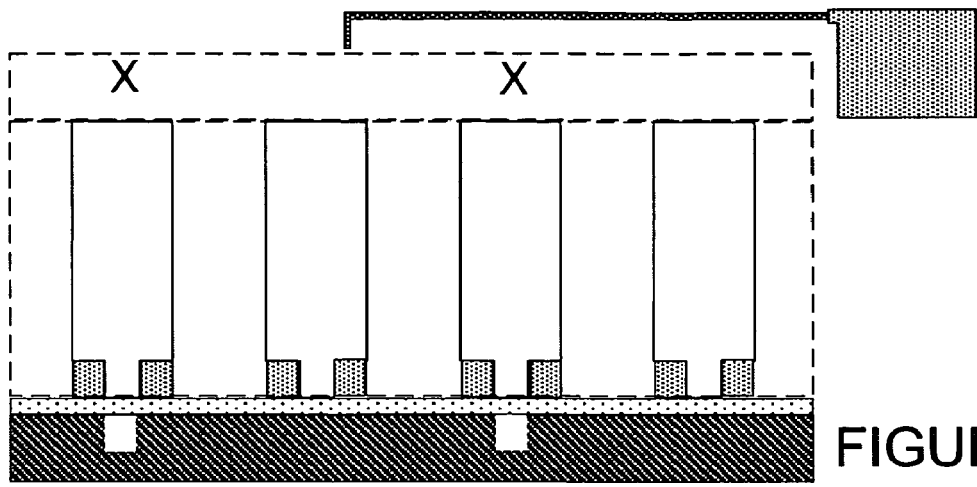
FIGS. 9A-9C show an array of lithography electrodes associated with an x-y motion device used to form a pattern.
Figure 9B:
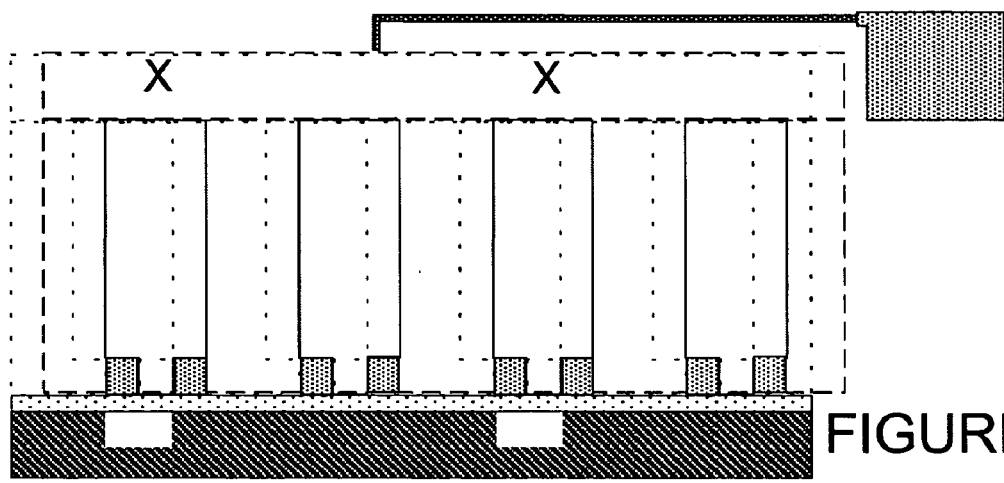
Figure 9C:
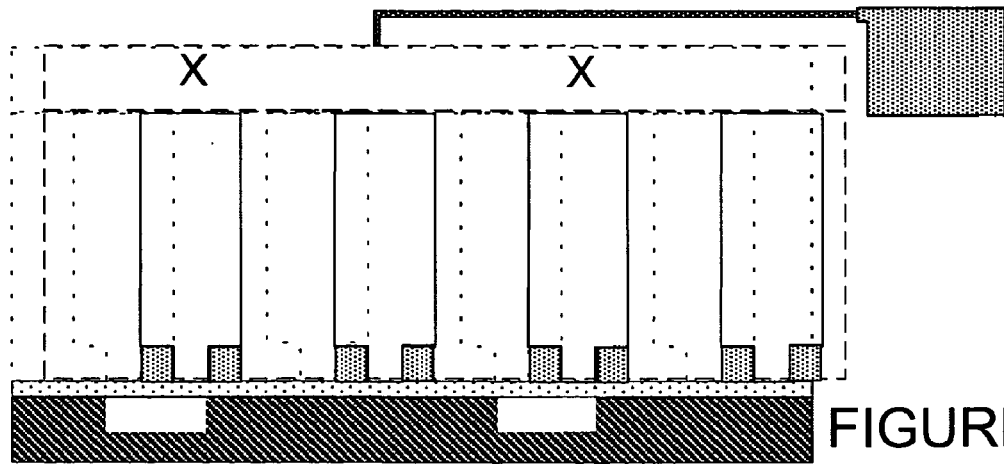
Figure 10A:
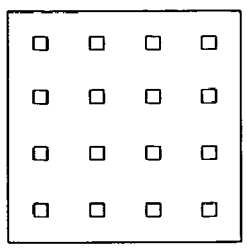
FIGS. 10A-10I show an x-y array of electrodes used to form a pattern.
Figure 10B:
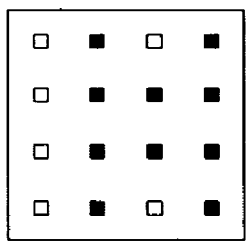
Figure 10C:
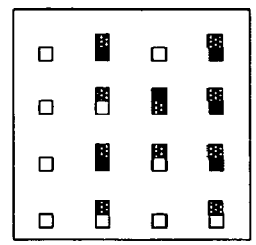
Figure 10D:
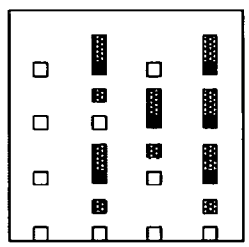
Figure 10E:
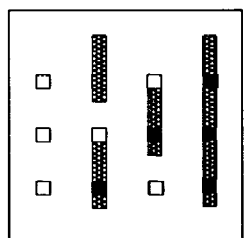
Figure 10F:
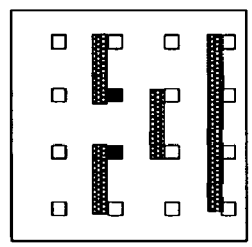
Figure 10G:
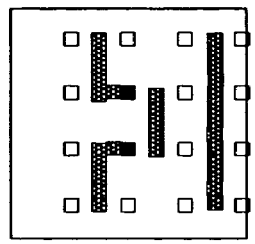
Figure 10H:
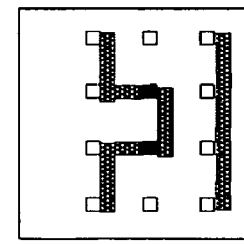
Figure 10I:
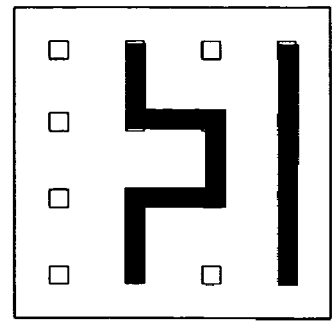

Referring now to FIGS. 9A-9C, an array of lithography electrodes is shown associated with an x-y motion device. As shown in FIG. 9A, the first and third electrodes (as viewed in the Figure from left to right) are activated to form associated marks. FIGS. 9B and 9C shows motion to the right, e.g., of a suitable amount to form a mark contiguous with the previously formed mark. Of course, other suitable X-Y motion may be provided, and other electrodes may be operably activated to form marks in any desired pattern. For example, FIGS. 10A-10I show an example of a lithographic pattern formed with a system 700 including an x-y array of electrodes (viewing the electrode tips of the system 700).

Figure 11A:
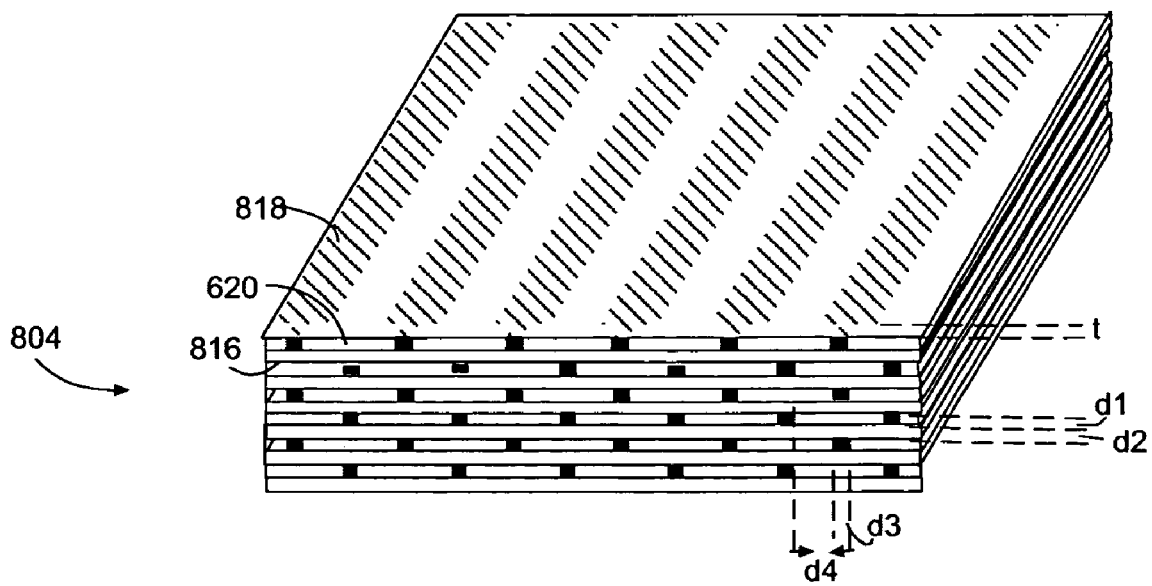
FIGS. 11A-11C shows an example of a lithography device formed according to a preferred embodiment herein.
Figure 11B:
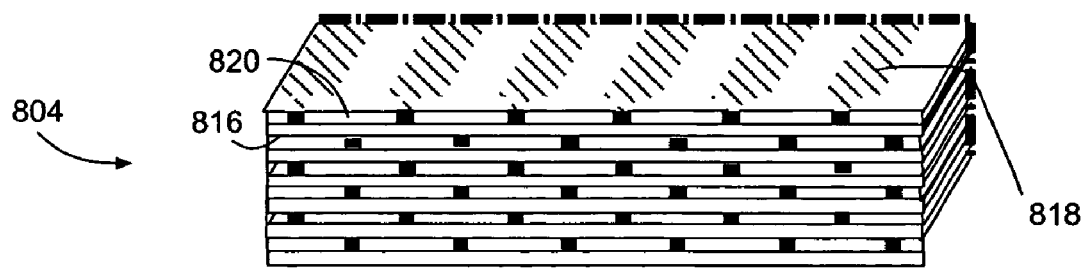
Figure 11C:
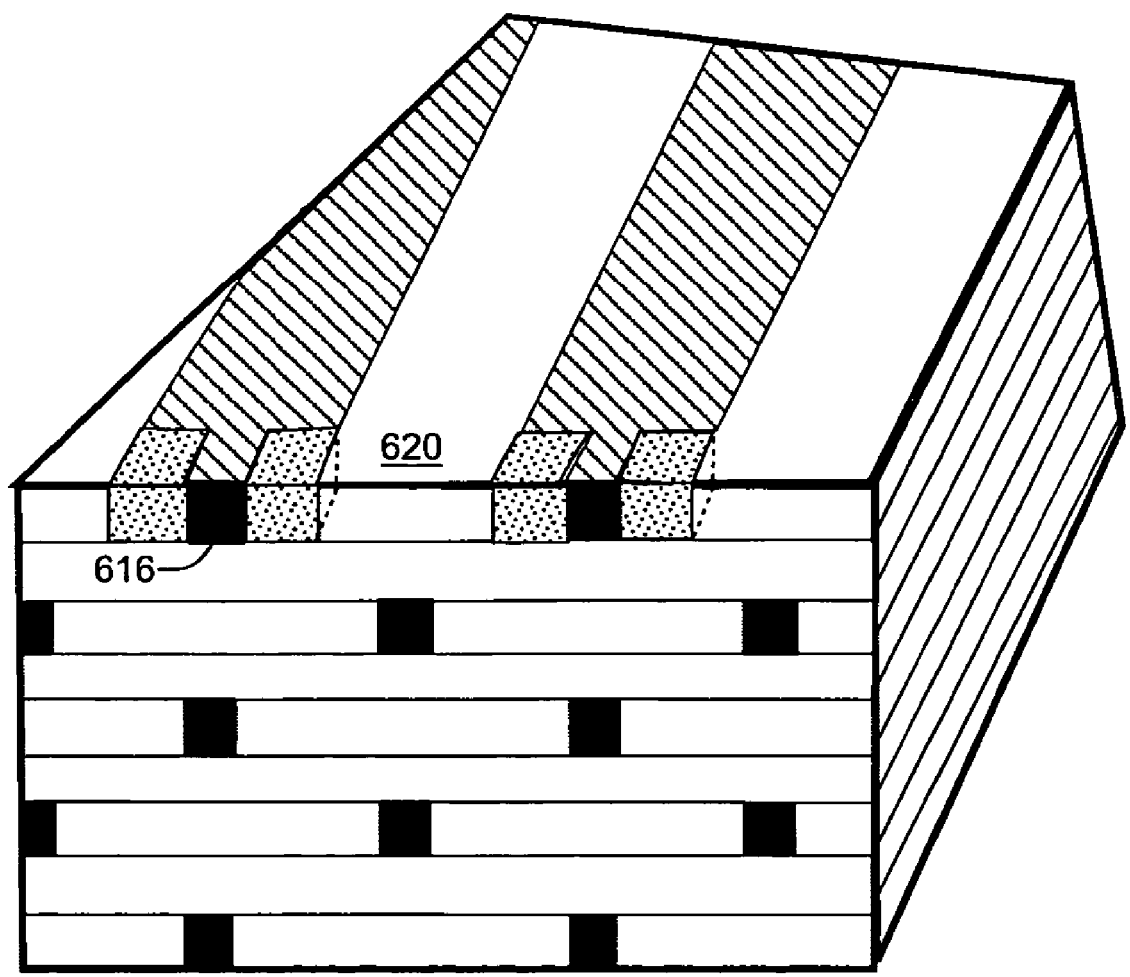

Referring now to FIGS. 11A-11C, a lithography device 804, and in preferred embodiments a nanolithography device, is generally depicted. FIG. 11A shows the device 804. FIG. 11B shows that upon formation of a device 804 (or a device 804' as described herein), it is possible to cut the device into plural devices, each having an array of exposed electrode tips 816 (or ends of conductors 818 not formed into tips 816). FIG. 11C shows an enlarged view of a portion of the device 804.

The device 804 includes a plurality of tips 816. Each tip 816 is formed as described further herein, and is a monolithic portion of a conductive strip 818. Electrochemical lithographic processing is accomplished, e.g., upon application of a voltage or field between tip(s) 816 and a substrate, as described generally with respect to FIGS. 3A and 3B herein.

Notably, the dimensions of the tip 816 $d_3$ is less than the dimension of the conductive strip 818 $d_4$. As shown, the width dimension of each strip 818 is substantially greater than the width of the tips 816. Accordingly, losses associated with resistivity of the conductors used for lithographic processing is minimized. Note that while FIGS. 11A-11C depict tips 816 arranged in a staggered fashion, it will be appreciated by one skilled in the art that the pattern of tips 816 on device 804 may be any desired pattern to achieve appropriate lithographic processing, and the manufacturing methods described herein may be readily adapted to accomplish such desired patterns.

Figure 12A:
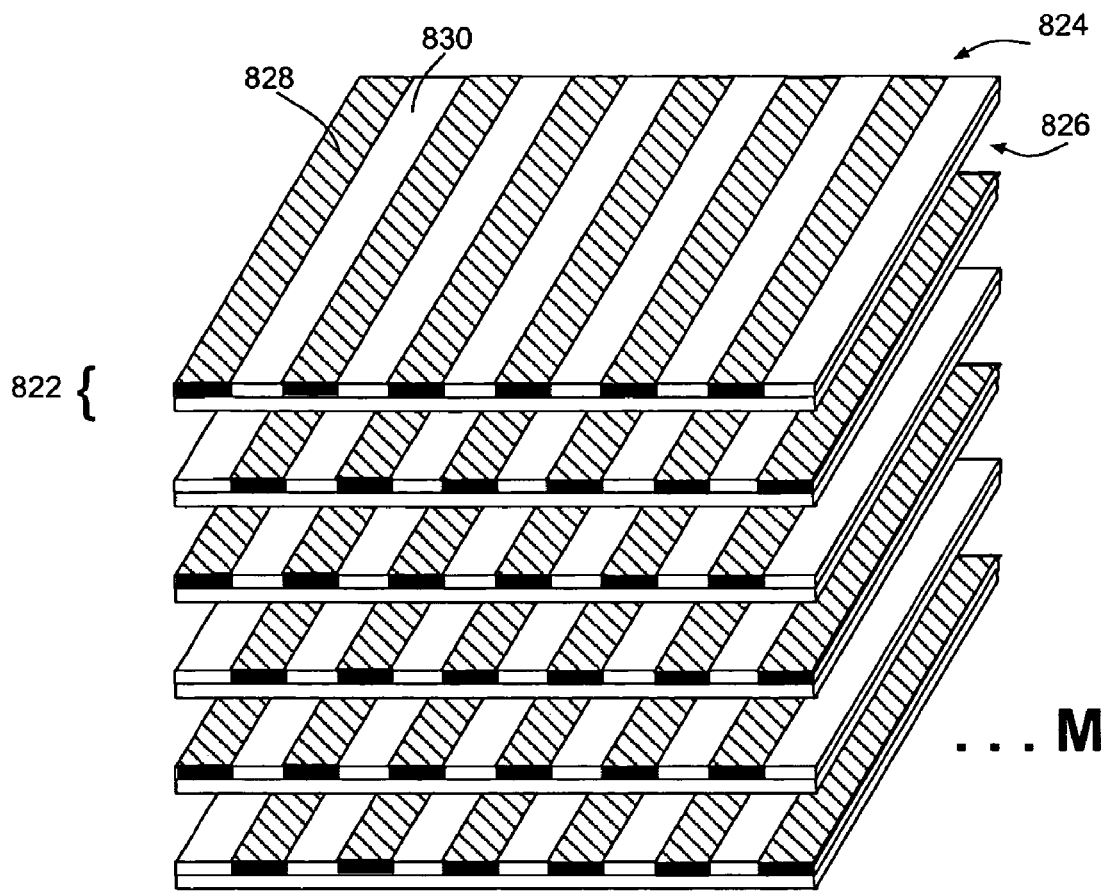
FIG. 12A show N layers used to form the lithography device of FIGS. 11A-11C.

In a preferred embodiment of manufacturing the device 804, and referring now to FIG. 12A, N layers 822 used to form a device 804 are shown. Each layer 822 generally includes a "striped" layer 824 and an insulator layer 826. As shown, strips 828 are patterned on striped layer 824 in a staggered fashion with respect to sequential layers 822. Insulative strips 830 are disposed between plural conductive strips 828. A total of M conductive strips 828 and insulative strips 830 may be provided, ultimately resulting in a device 804 having approximately M×N tips 816.

During fabrication of the layered structure, each layer may be polished to a substantially uniform thickness, depending on the tolerances of the desired system. Know techniques such as grinding, polishing; chemical-mechanical polishing; polish-stop, or combinations including at least one of the foregoing techniques may be used.

It should be appreciated that a particular pattern of tips 816 may be manufactured by varying:

the horizontal period of conductive strips 828 and insulative strips 830;

the pattern between sequential layers 822;

the thickness of different layers 822;

the thickness of different conductive strips 828 and/or insulative strips 830; and/or the thickness of different insulative layers 826.

Conductive strips 828 may be formed of any suitable electrically conductive materials including, but not limited to, platinum, palladium, gold, silver, copper, brass, tin, ferrous metals such as stainless steel, nickel, carbon, electrically conducting polymers, electrically conducting ceramics, or combinations and alloys comprising at least one of the foregoing materials. In general, the conductive material should be chosen so that it is electrochemically compatible with chosen substrate (e.g., workpiece 302 shown in FIG. 4), and stable without generating impurities. In certain embodiments, the material should be oxidizable yet capable of oxidizing other materials.

Insulative strips 830 and insulative layers 826 may be formed of the same or different materials, depending on the application thereof. Such insulative materials include, but are not limited to, electrically insulating plastics or polymers, ceramics, or glass materials, MgO, ZnO, TiO, other known oxides, nitrides of metals, SiN, or any other suitable insulative material.

Figure 12B:
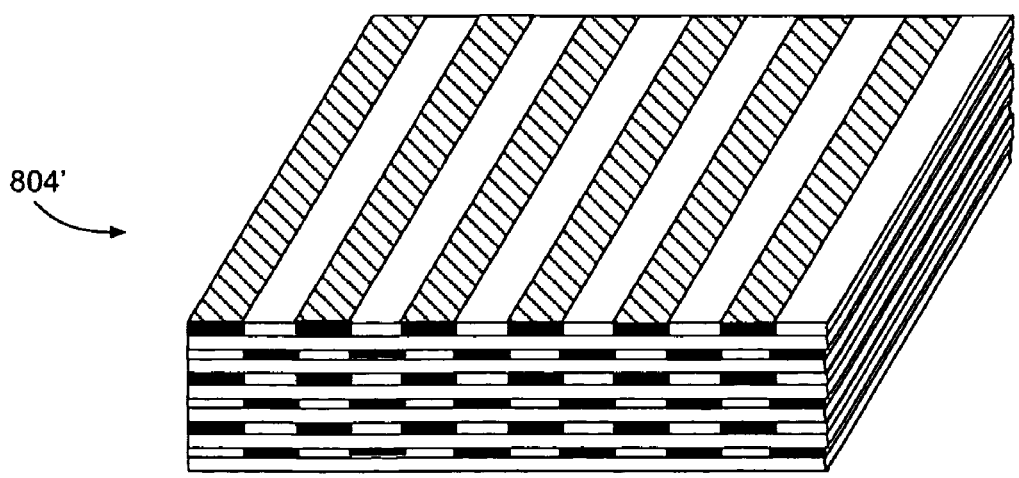
FIG. 12B shown N layers stacked and bonded to form a lithography device of FIGS. 11A-11C.

Referring now to FIG. 12B, N layers 822 are stacked and bonded to form a device 804'. This device 804' will be used to ultimately form the lithographic writing structure or device 804 shown in FIGS. 11A-C. Note that the device 804' may be suitable for certain lithography procedures, wherein the tip dimension d3 (FIG. 11A) need not be reduced from the width dimension of the conductor 818.

Formation of tips 816 may be accomplished my various methods. For example, as described herein with respect to FIGS. 13-15, the tips 816 may be formed by electrochemical oxidation. One of skill in the art may appreciate that the exposed electrode ends may be polished, depending on the tolerances of the desired system. Know techniques such as grinding, polishing; chemical-mechanical polishing; polish-stop, or combinations including at least one of the foregoing techniques may be used.

Figure 13:
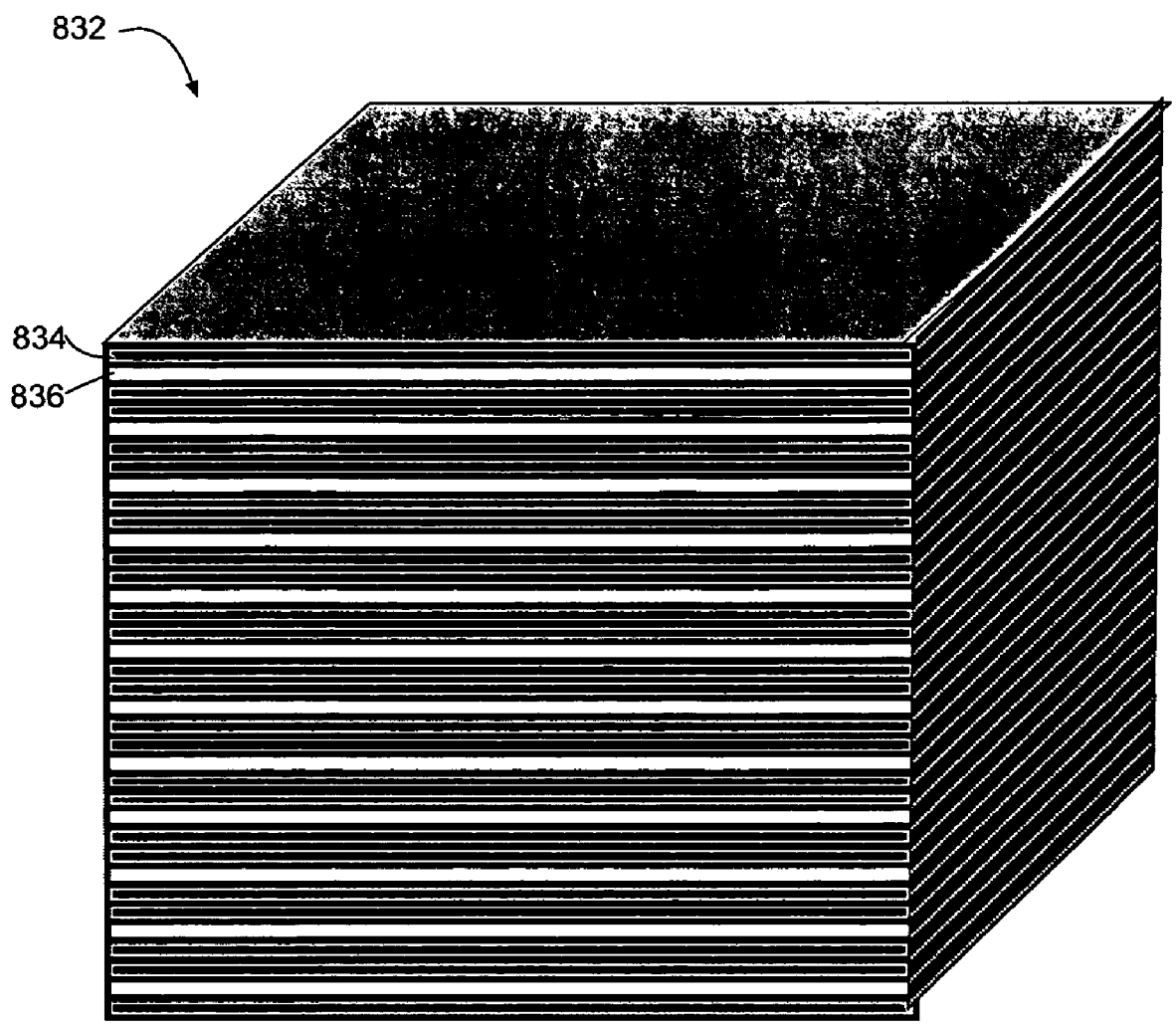
FIG. 13 shows a device used to form electrode tips in certain embodiments hereof.

Referring now to FIG. 13, a device 832 is shown. Device 832 generally includes plural layers, each layer having a relatively thin insulative layer 834 and a thicker conductive layer 836. In preferred embodiments, there are provided at least M layer. In other embodiments, the number of insulative layers 834 is at least equal to the greatest number of conductive strips 828 across device 804'.

Referring now to FIGS. 14A and 15, device 832 is shown interposed adjacent device 804'. By maintaining contact between conductive portions 836 and the edge of strips 828, and application of a voltage by conductive portions 836, the tips 816 of FIG. 11A-C may be formed, shown in FIG. 14B. This is accomplished generally by known electrochemical oxidation principles, whereby the conductive materials of the strips 828 are oxidized. By controlling the voltage or current, the depth t of the tip 816 (relative the remainder of the body of conductive strips 828) may be controlled.

Alternatively, sufficient proximity may be maintained between conductive portions 836 and the edge of strips 828, whereupon impression of an electric field by conductive portions 836 forms the tips 816. By controlling the electric field, the depth t of the tip 816 may be controlled.

Figure 16A:
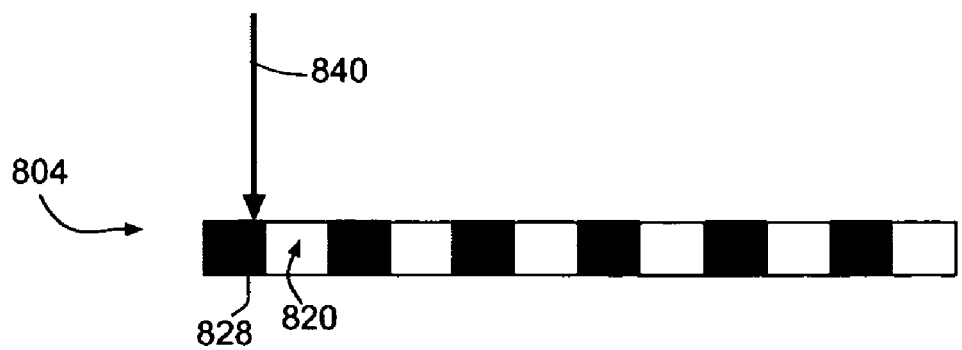
FIGS. 16A and 16B shows a deposition based method of forming electrode tips.
Figure 16B:
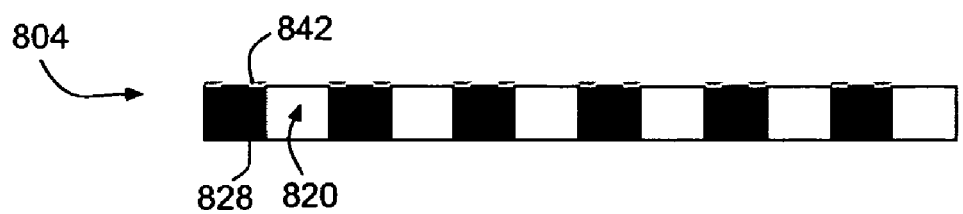

Referring now to FIGS. 16A and 16B, another method of forming tips 816 is shown. For example, material 842 may be deposited at the edges of the strips 828. Material 842 may be deposited 840 by suitable nozzle structures, vapor deposition, solid deposition, or other deposition methods. In certain embodiments, it may be desirable to etch or otherwise remove the edges of strips 828 prior to depositing material 842.

Figure 17A:
FIGS. 17A and 17B show a subtraction method of forming electrode tips.
Figure 17B:
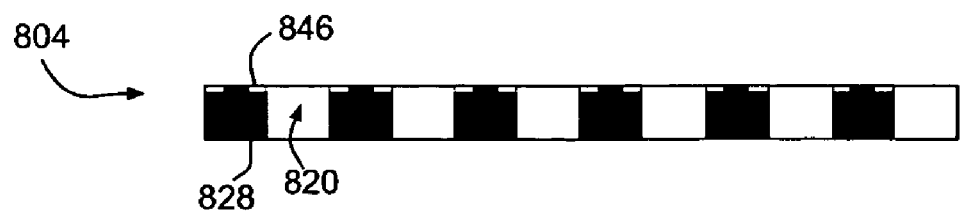

Referring now to FIGS. 17A and 17B, another method of forming tips 816 is shown. For example, material 846 may be removed at the edges of the strips 828. Material 846 may be removed 844 by suitable nozzle structures, focused ion beam systems, electron beam systems, x-ray systems, other oxidation/anodization methods, or any other suitable subtractive processing methods.

There herein described systems may be used to write lithographic patterns, to read patterns and to erase patterns. As described above, lithographic patterns may be written by oxidizing or reducing the workpiece or substrate. For example, suitable voltages are used sufficient to oxidize or reduce the substrate. However, with the same or a substantially similar lithography device, the patterns may be read. For example, when indication of a mark or pattern that is read is provided by completion of a circuit at the area of the mark or pattern. Further, to erase lithographic patterns or marks, the electrochemical processes used to write the patterns may be reversed.

With the herein lithography device including an of electrode ends (in certain embodiments having smaller tips), other lithography operations are also possible. One operation includes electrostatic xerography (whereby material traces or marks may be deposited and charged to facilitate electrostatic lithography). Another possible operation includes formation of A key benefit of the presently described lithography device and methods of manufacturing lithography devices is the ability to fabricate devices with very small tip dimensions. For example, as shown in FIG. 11A, the thickness dimension d1 may be on the order of nanometers, which is realizable since current technology allows for deposition of layers of 10s of nanometers.

Further, the width dimension d3 as shown in FIG. 11A may also be on the order of nanometers, as the present methods and device departs from traditional reliance on trace widths (e.g., whereby presently available technology is on the order of 0.1 microns). This is realizable as the dimension d3 depends on the thickness the insulative layer 836 between conductive layers 834, rather than a horizontal width dimension.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of manufacturing a lithography device comprising:
   forming a conductive strip on a mixed conductive-insulative layer; and
   laminating, adhering or molding the mixed conductive-insulative layer between plural insulative layers or between insulative material, wherein the conductive strip has a body and is arranged having a first terminal end and a second terminal end exposed through the insulative structure, further comprising
   arranging a tip forming structure having an insulative strip or layer between a pair of conductive strips or layers such that the conductive strips or layers of the tip forming structure are adjacent the second terminal end; and
   applying a potential to the tip forming structure to oxidize portions of the second terminal end,
   wherein conductive tips at the second terminal end are formed having sectional dimensions less than that of the body of the conductive strip.

2. The method as in claim 1, wherein a depth of the tip is defined by the potential applied.

3. The method as in claim 1, wherein the insulative strip or layer of the tip forming structure has a thickness corresponding to a width dimension of the conductive tip.

4. The method as in claim 1, wherein tip forming structure, and a structure formed by laminating, adhering or molding the mixed conductive-insulative layer between plural insulative layers or between insulative material, are arranged normal to one another.

* * * * *